United States Patent
Bhushan et al.

(10) Patent No.: US 11,769,756 B2
(45) Date of Patent: Sep. 26, 2023

(54) SEMICONDUCTOR ASSEMBLIES WITH HYBRID FANOUTS AND ASSOCIATED METHODS AND SYSTEMS

(71) Applicant: Lodestar Licensing Group, LLC, Evanston, IL (US)

(72) Inventors: Bharat Bhushan, Taichung (TW); Pratap Murali, Meridian, ID (US); Raj K. Bansal, Boise, ID (US)

(*) Notice: Subject to any disclaimer, the term of this patent is extended or adjusted under 35 U.S.C. 154(b) by 0 days.

(21) Appl. No.: 17/850,992

(22) Filed: Jun. 27, 2022

(65) Prior Publication Data
US 2022/0328456 A1  Oct. 13, 2022

Related U.S. Application Data

(62) Division of application No. 17/103,486, filed on Nov. 24, 2020, now Pat. No. 11,450,645.

(51) Int. Cl.
*H01L 25/065* (2023.01)
*H01L 21/56* (2006.01)
(Continued)

(52) U.S. Cl.
CPC ........ *H01L 25/0657* (2013.01); *H01L 21/561* (2013.01); *H01L 21/568* (2013.01); *H01L 23/3185* (2013.01); *H01L 24/05* (2013.01); *H01L 24/11* (2013.01); *H01L 24/13* (2013.01); *H01L 24/16* (2013.01); *H01L 24/48* (2013.01); *H01L 24/85* (2013.01); *H01L 24/92* (2013.01);
(Continued)

(58) Field of Classification Search
CPC ... H01L 25/0657; H01L 25/50; H01L 21/561; H01L 21/568; H01L 23/3185; H01L 24/05; H01L 24/11; H01L 24/13; H01L 24/16; H01L 24/48; H01L 24/85; H01L 24/92; H01L 2225/06506; H01L 2225/06517; H01L 2225/06562; H01L 2224/02379; H01L 2224/02381; H01L 2224/04105; H01L 2224/13024; H01L 2224/16225; H01L 2224/48145; H01L 2224/9222; H01L 2924/14511; H10B 80/00

See application file for complete search history.

(56) References Cited

U.S. PATENT DOCUMENTS 9,496,216 B2   11/2016   Chun et al.
9,761,562 B2   9/2017    Ye et al.
(Continued)

*Primary Examiner* — Timor Karimy
(74) *Attorney, Agent, or Firm* — Holland & Hart LLP

(57) ABSTRACT

Hybrid fanouts for semiconductor device assemblies, and associated methods and systems are disclosed. In one embodiment, at least one edge a first semiconductor die is attached to a molding including through mold vias (TMVs). Conductive traces may be formed on a first side of the first semiconductor die, where the first side includes integrated circuitry coupled to the conductive traces. Moreover, conductive pads may be formed on a surface of the molding, which is coplanar with the first side. The conductive pads are coupled to first ends of the TMVs, where second ends of the TMVs are coupled to bond wires connected to one or more second semiconductor dies that the first semiconductor die carries. Conductive bumps can be formed on the conductive traces and pads such that the first semiconductor die and the molding attached thereto can be directly attached to a printed circuit board.

19 Claims, 7 Drawing Sheets

(51) Int. Cl.
*H01L 23/31* (2006.01)
*H01L 23/00* (2006.01)
*H01L 25/00* (2006.01)

(52) U.S. Cl.
CPC .... *H01L 25/50* (2013.01); *H01L 2224/02379* (2013.01); *H01L 2224/02381* (2013.01); *H01L 2224/04105* (2013.01); *H01L 2224/13024* (2013.01); *H01L 2224/16225* (2013.01); *H01L 2224/48145* (2013.01); *H01L 2224/9222* (2013.01); *H01L 2225/06506* (2013.01); *H01L 2225/06517* (2013.01); *H01L 2225/06562* (2013.01); *H01L 2924/14511* (2013.01)

(56) References Cited

U.S. PATENT DOCUMENTS

| | | |
|---|---|---|
| 2010/0109143 A1 | 5/2010 | Cho |
| 2010/0133704 A1* | 6/2010 | Marimuthu ......... H01L 23/3128 257/E23.116 |
| 2013/0182402 A1* | 7/2013 | Chen ................... H01L 23/5389 361/807 |
| 2017/0186737 A1 | 6/2017 | Fang et al. |

* cited by examiner

SEMICONDUCTOR ASSEMBLIES WITH HYBRID FANOUTS AND ASSOCIATED METHODS AND SYSTEMS

CROSS-REFERENCE TO RELATED APPLICATION(S)

This application is a division of U.S. patent application Ser. No. 17/103,486, filed Nov. 24, 2020; which is incorporated herein by reference in its entirety.

TECHNICAL FIELD

The present disclosure generally relates to semiconductor assemblies, and more particularly relates to hybrid fanouts for semiconductor assemblies.

BACKGROUND

Semiconductor packages typically include a semiconductor die (e.g., memory chip, microprocessor chip, imager chip) mounted on a substrate and encased in a protective covering. The semiconductor die may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

Market pressures continually drive semiconductor manufacturers to reduce the volume of semiconductor packages to fit within the space constraints of electronic devices. In some semiconductor packages, direct chip attach methods (e.g., flip-chip bonding between the semiconductor die and the substrate) may be used to reduce the footprint of the semiconductor packages. Such direct chip attach methods may include directly connecting multiple conductive pillars electrically coupled to the semiconductor die to corresponding conductive structures (e.g., conductive bumps) of the substrate. In some semiconductor packages, the thickness of the semiconductor dies tends to be reduced to stack multiple semiconductor dies without increasing overall heights of the semiconductor packages.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1:
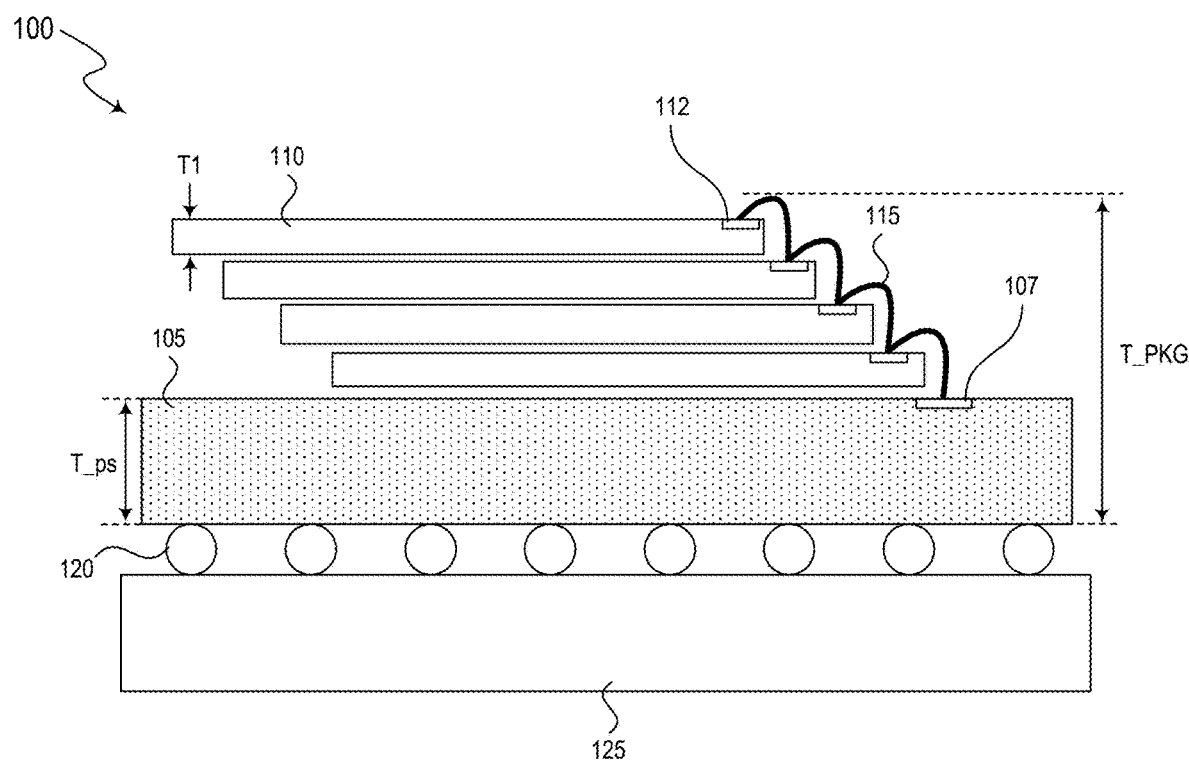
FIG. 1 is a cross-sectional view of a semiconductor device assembly.

Specific details of several embodiments directed to hybrid fanouts for semiconductor assemblies, and associated systems and methods are described below. Certain semiconductor packages may include multiple semiconductor dies (e.g., 3-dimensional (3D) NAND memory dies, DRAM dies, memory controllers, logic dies, etc.) within specified physical dimensions—e.g., footprints, heights/thicknesses, which may be collectively referred to as form factors. In some embodiments, such multi-die packages (MDPs) include package substrates, to which multiple semiconductor dies are attached. Further, the MDPs may include bond wires to connect the semiconductor dies to the package substrates such that the semiconductor dies can communicate with higher level circuitry through conductive interconnects (e.g., ball grid array (BGA)) that attach the package substrates to a printed circuit board (PCB).

Advanced semiconductor packaging technologies pursue increasing storage capacity within a given form factor and/or providing scaled (reduced) form factors without sacrificing storage capacity. In some embodiments, an increased quantity of memory dies may be attached to a package substrate to increase storage capacity of a semiconductor assembly (which may also be referred to as a semiconductor device assembly) while maintaining a certain form factor (e.g., the height of the assembly). To this end, thicknesses of the memory dies may be reduced to facilitate stacking the increased quantity of memory dies. The thinned semiconductor dies, however, may not be able to satisfy various physical and/or mechanical requirements (e.g., specifications directed to strength of the semiconductor die), thereby presenting reliability and/or yield issues for the semiconductor assembly. Further, in view of increasing die sizes for advanced semiconductor technology nodes, thinning of the semiconductor dies is expected to be increasingly challenging.

The present technology provides for a semiconductor assembly without a package substrate, which employs a hybrid fanout scheme for the semiconductor assembly. As the package substrate can occupy significant part of a total thickness of the semiconductor assembly, thicknesses of the semiconductor dies can be increased by eliminating the package substrate to satisfy the physical and/or mechanical requirements while maintaining the same thickness of the semiconductor assembly. Alternatively, or additionally, eliminating the package substrate would present opportunities for scaling the thickness of the semiconductor assembly. In other words, by eliminating the package substrate, the thickness of the package substrate may be appropriately allocated to strengthening the semiconductor dies and/or reducing the overall thickness of the semiconductor assembly. Further, eliminating the package substrate can reduce the manufacturing cost and simplify designing of the semiconductor assemblies by excluding a third party who designs and supplies the package substrate.

As described in more detail herein, the present technology provides for integrating aspects of a fanout wafer level packaging (WLP) scheme to attach a molding to at least one edge of a semiconductor die. Further, conductive traces (e.g., redistribution layers (RDLs)) and pads are formed on an active side of the semiconductor die (a side including various integrated circuits and/or active features) and on the corresponding side of the molding, respectively. Subsequently, through mold vias (TMVs) are formed in the molding, which are connected to the conductive pads. In this manner, the semiconductor die has the TMVs adjacent to at least one edge ("fanout TMVs") such that the semiconductor die can replace the package substrate.

One or more semiconductor dies can be attached to a passive side (an opposite site of the active side) of the semiconductor die having the fanout TMVs. The one or more semiconductor dies each includes bond pads, and bond wires can be formed to couple the bond pads to the fanout TMVs. Subsequently, the semiconductor die carrying the one or more semiconductor dies and the molding attached thereto can be attached to a PCB through conductive interconnects (e.g., BGA) formed on the conductive traces and pads. As such, the semiconductor die (carrying the one or more semiconductor dies) and the molding (including the fanout TMVs) can be attached to the PCB without a package substrate. Further, the semiconductor assembly may transmit and/or receive signals through the bond wires and the fanout TMVs—thus, a hybrid fanout scheme utilizing both the bond wires and the fanout TMVs for the semiconductor assembly.

FIG. 1 is a cross-sectional view of a semiconductor device assembly 100 mounted on a PCB 125. The semiconductor device assembly 100 includes a package substrate 105 attached to the PCB 125 through conductive structures 120 (e.g., BGA, solder balls). The package substrate 105 carries semiconductor dies 110 (e.g., four (4) semiconductor dies 110). The package substrate 105 further includes substrate pads (one of which is depicted as a substrate pad 107) coupled with bond pads 112 of the semiconductor dies 110 through bond wires 115. In this manner, the semiconductor dies 110 transmit and/or receive signals through the bond wires 115. The package substrate 105 may include interconnects (not shown) coupling the substrate pads 107 to the conductive structures 120. In some embodiments, the package substrate 105 may be approximately 160 micrometers thick (T_ps=160 μm), and the semiconductor dies 110 may be approximately 40 micrometers thick (T1=40 μm). Thus, the semiconductor device assembly 100 has a thickness of approximately 320 micrometers (T_PKG=320 μm) without accounting for the thickness of the conductive structures 120. In some embodiments, the 40 μm thick semiconductor dies 110 may be marginal to satisfy the die strength specifications and subject to reliability and/or yield issues—e.g., due to the semiconductor die breakage during the packaging process.

Figure 2:
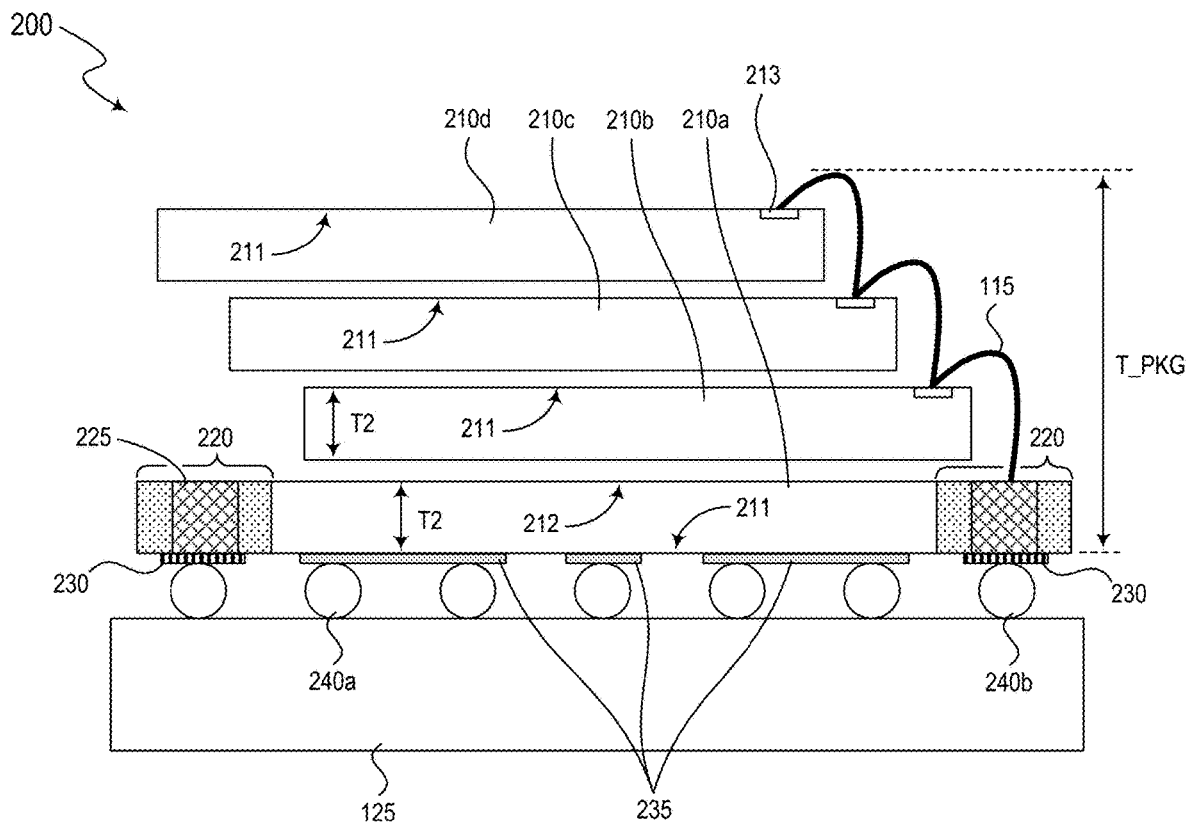
FIG. 2 is a cross-sectional view of a semiconductor device assembly in accordance with embodiments of the present technology.

FIG. 2 is a cross-sectional view of a semiconductor device assembly 200 in accordance with embodiments of the present technology. The semiconductor device assembly 200 includes four semiconductor dies 210 (also identified individually as 210a-d) stacked on top of another. In some embodiments, the semiconductor dies 210 are structurally identical—e.g., all four semiconductor dies 210 are 3D NAND memory dies that are structurally identical. The bottommost semiconductor die (semiconductor die 210a), however, is modified to include various structures that facilitates the hybrid fanout scheme for the semiconductor device assembly 200. For example, the semiconductor die 210a has conductive traces 235 formed on its first side 211. Moreover, moldings 220 are attached to edges of the semiconductor die 210a, which include one or more through mold vias (TMVs) 225. The TMVs are coupled to conductive pads 230 at one ends and to bond wires 115 at opposite ends. Further, the semiconductor die 210a has conductive bumps 240 attached to the conductive traces 235 (e.g., the conductive bump 240a) and the conductive pads 230 (e.g., the conductive bump 240b) such that the semiconductor die 210a (and the moldings 220 attached thereto) can be directly attached to the PCB 125. Accordingly, the semiconductor device assembly 200 does not include a package substrate (e.g., the package substrate 105 described with reference to FIG. 1).

In some embodiments, a thickness of the semiconductor dies 210 is greater than the semiconductor dies 110. For example, the thickness of the semiconductor dies 210 may be approximately 75 μm. Moreover, thicknesses of the conductive traces 235 and conductive pads 230 may be approximated 20 μm, in some embodiments. Thus, the thickness (T_PKG) of the semiconductor device assembly 200 (without accounting for the thickness of the conductive bumps 240) can be maintained approximately the same as the thickness (T_PKG) of the semiconductor device assembly 100 while the thickness of the semiconductor dies 210 is greater than the thickness of the semiconductor dies 110—e.g., by approximately 35 μm (i.e., by about 85%). As such, the semiconductor dies 210 are expected not only to satisfy the die strength specifications but also to provide additional margin against the specification.

Further, as an example, if the thickness of the semiconductor dies 210 can be increased to 60 μm or so to satisfy the die strength specifications, a new thickness of the semiconductor device assembly 200 would be reduced to approximately 260 μm, which is about than 80% of the thickness (T_PKG) of the semiconductor device assembly 100 (or the semiconductor device assembly 200). In this manner, a form factor can be scaled for the semiconductor device assembly 200, if desired, compared to the semiconductor device assembly 100. If the form factor is maintained the same between the semiconductor device assemblies 100 and 200, the semiconductor device assembly 200 can accommodate a stack of five (5) semiconductor dies 210, instead of four (4) semiconductor dies 210, which in turn provides 25% increased memory capacity for the semiconductor device assembly 200.

In some embodiments, the semiconductor device assembly 200 includes a first semiconductor die (e.g., the bottommost semiconductor die 210a) that has a first side 211 and a second side 212 opposite to the first side 211. The first side 211 may include conductive traces 235 (e.g., redistribution layer (RDL) including copper) and first conductive bumps 240 (one of which is identified as 240a) connected to the conductive traces 235. Further, the first side 211 of the first semiconductor die may include one or more integrated circuits (i.e., integrated circuitry) of the first semiconductor die, and may be referred to as an active side of the first semiconductor die. Similarly, the second side 212 may be referred to as a passive side of the first semiconductor die. As shown in FIG. 2, the first semiconductor die is coupled to the PCB 125 through the conductive traces 235 and the first conductive bumps 240 (e.g., the conductive bump 240a), and the first side 211 of the first semiconductor die faces toward the PCB 125.

One or more edges of the first semiconductor die may be attached to (or conjoined with) moldings 220—e.g., moldings 220 at both edges as shown in FIG. 2. Although the first semiconductor die is depicted to have two (2) moldings 220 in the cross-sectional side view of FIG. 2, the first semiconductor die may have one (1), three (3), or four (4) edge(s) attached to the molding(s) 220. In some embodiments, the first semiconductor die may be surrounded by the moldings 220. Further, the first semiconductor die and the moldings 220 may have approximately the same thickness (e.g., within ±3%, ±5%, or ±10%, or the like). As such, the moldings 220 have first surfaces coplanar with the first side 211 of the first semiconductor die and second surfaces coplanar with the second side 212 of the first semiconductor die. Individual moldings 220 include one or more TMVs 225 (e.g., fanout TMVs), each of which extends from the first surface to the second surface of the molding 220. Further, the first surface of the moldings 220 have conductive pads 230 connected to the TMVs 225, which may also be referred to as landing pads for the TMVs 225. The conductive pads 230 are further connected to second conductive bumps 240 (one of which is identified as 240b).

The semiconductor device assembly 200 also includes one or more second semiconductor dies (e.g., semiconductor dies 210b-d) attached to the second side 212 of the first semiconductor die. Individual second semiconductor dies include bond pads 213 on their first sides 211. The first sides 211 of the second semiconductor dies include one or more integrated circuits that are coupled to the bond pads 213. As depicted in FIG. 2, the first sides 211 of the second semiconductor dies face away from the first semiconductor die. The bond pads 213 of the second semiconductor dies are coupled to the TMVs 225 through bond wires 115 (one of which is shown in FIG. 2). In this manner, the second semiconductor dies may transmit and/or receive signals through a combination of the bond wires 115 and the TMVs 225—thus, the hybrid fanout for the semiconductor device assembly 200.

In some embodiments, the conductive traces 235 of the first semiconductor die are coupled with the conductive pads 230 of the molding(s) 220. In this manner, the first semiconductor die may transmit/receive signals to/from other components attached to the PCB 125 through both the first and second conductive bumps (e.g., conductive bumps 240a and 240b). Similarly, the second semiconductor dies may transmit/receive signals to/from other components attached to the PCB 125 through both the first and second conductive bumps (e.g., conductive bumps 240a and 240b). As shown in FIG. 2, the first and second conductive bumps 240 (e.g., BGA, solder bumps, solder balls, etc.) are configured to directly couple the first semiconductor die (carrying the second semiconductor dies) and the molding(s) 220 to the PCB 125. Accordingly, the package substrate 105 of the semiconductor device assembly 100 can be omitted in the semiconductor device assembly 200.

Although in the foregoing example embodiments, the semiconductor device assembly 200 is described and illustrated to include four (4) semiconductor dies, the present technology is not limited thereto. For example, the semiconductor device assembly 200 may include different quantities of semiconductor dies—e.g., two (2), three (3), five (5), eight (8), sixteen (16), or even greater. Further, the first semiconductor die (e.g., the semiconductor die 210a) may be different than the second semiconductor dies (e.g., the semiconductor dies 210b-d). For example, the first semiconductor die may be a memory controller or a logic die, and the second semiconductor dies may be 3D NAND memory dies, or DRAM dies, or the like.

Figure 3A:
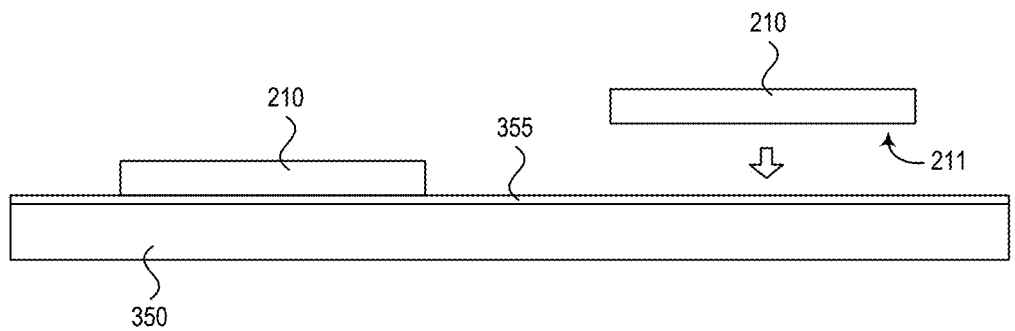
FIGS. 3A through 3I illustrate stages of a process for forming a semiconductor device assembly in accordance with embodiments of the present technology.

FIGS. 3A through 3I illustrate stages of a process for forming a semiconductor device assembly (e.g., the semiconductor device assembly 200) in accordance with embodiments of the present technology. FIG. 3A illustrates a mold frame 350 with an adhesive material 355. Further, first sides 211 of semiconductor dies 210 (e.g., the bottommost die 210a of the semiconductor device assembly 200) can be attached to the mold frame 350 through the adhesive material 355 (as indicated with an arrow). In some embodiments, portions of the semiconductor dies 210 can be removed from the second sides 212 (i.e., the passive side) prior to attaching the first sides 211 of the semiconductor dies 210 to the mold frame 350. For example, the thickness of the semiconductor dies 210 may be reduced to a final thickness (e.g., T2 of 75 um) or to an intermediary thickness greater than the final thickness (e.g., to mitigate risks of damaging the semiconductor dies 210 during the packaging process), which may be further reduced to the final thickness at later process step(s) as described with reference to FIGS. 3E and 3F.

Figure 3B:
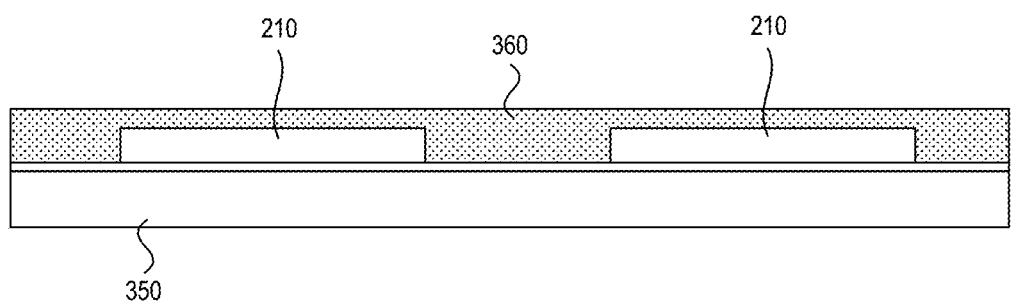

FIG. 3B illustrates a molding material 360 dispensed over the semiconductor dies 210 attached to the mold frame 350. Further, the molding material 360 can be cured while applying pressure (e.g., as in a wafer level compression molding process) such that the molding material 360 can surround and attach to the semiconductor dies 210.

Figure 3C:
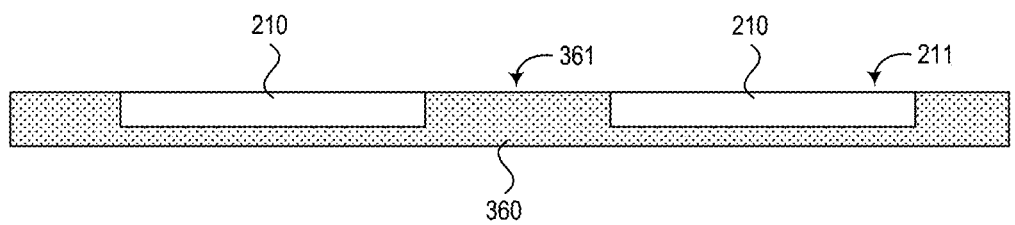

FIG. 3C illustrates the cured molding material 360 detached from the mold frame 350 (e.g., by dissolving the adhesive material 355), in which the semiconductor dies 210 are located. In FIG. 3C, the molding material 360 including the semiconductor dies 210 is flipped with respect to that of FIG. 3B. Further, a first surface 361 of the molding material 360 is coplanar with first sides 211 of the semiconductor dies 210.

Figure 3D:
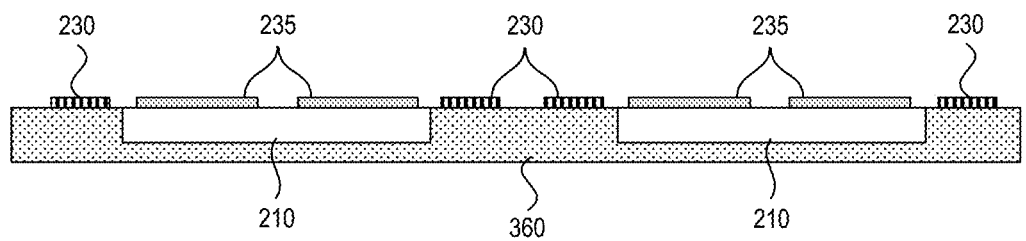

FIG. 3D illustrates the molding material 360 including the semiconductor dies 210 after the conductive traces 235 have been formed on the first sides 211 of the semiconductor dies 210. Also, the conductive pads 230 have been formed on the first surface 361 of the molding material 360.

Figure 3E:
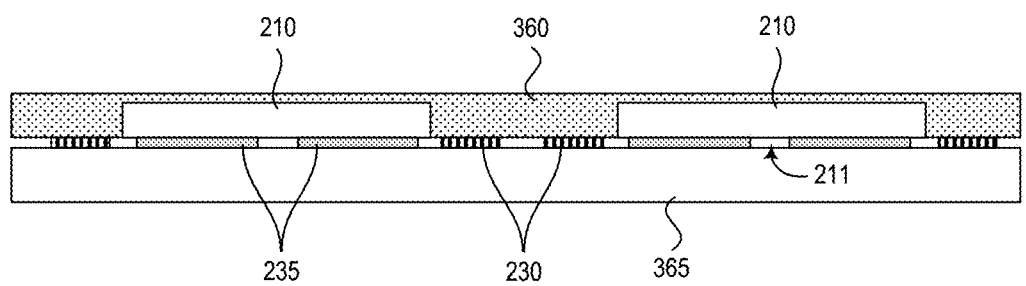
Figure 3F:
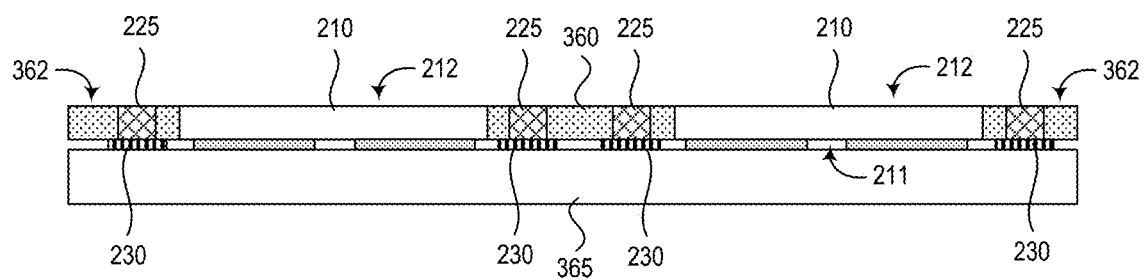

FIG. 3E illustrates that a carrier substrate 365 has been attached to the conductive traces 235 and the conductive pads 230. In FIG. 3E, the molding material 360 including the semiconductor dies 210 is flipped with respect to that of FIG. 3D. Subsequently, a portion of molding material 360 may be removed (e.g., using a back grinding process, chemical mechanical polishing (CMP) process, etc.) such that the molding material 360 and the semiconductor dies 210 have the approximately same thickness (as shown in FIG. 3F). In some embodiments, the thickness of the semiconductor dies 210 is reduced to the final thickness (e.g., T1=75 um).

FIG. 3F is a cross-sectional view of the molding material 360 including the semiconductor dies 210 after the portion of the molding material 360 has been removed (and/or the thickness of the semiconductor dies 210 is reduced to the final thickness). As a result of removing the portion of the molding material 360, the second sides 212 of the semiconductor dies 210 are exposed. Further, the second surface 362 of the molding material 360 is coplanar with the second sides 212 of the semiconductor dies 210. Further, FIG. 3F illustrates that the TMVs 225 have been formed after removing the portion of the molding material 360. In some embodiments, a laser drilling process may be utilized to form openings extending from the second surface 362 toward the first surface 361 of the molding material 360. The laser drilling process may terminate in response to reaching the conductive pads 230 (which may also be referred to as landing pads for this reason) formed on the first surface 361. Subsequently, the openings can be filled with a conductive material (e.g., copper) to form the TMVs. Additionally, or alternatively, a dry etch process may be utilized to form the openings in the molding material 360.

Figure 3G:
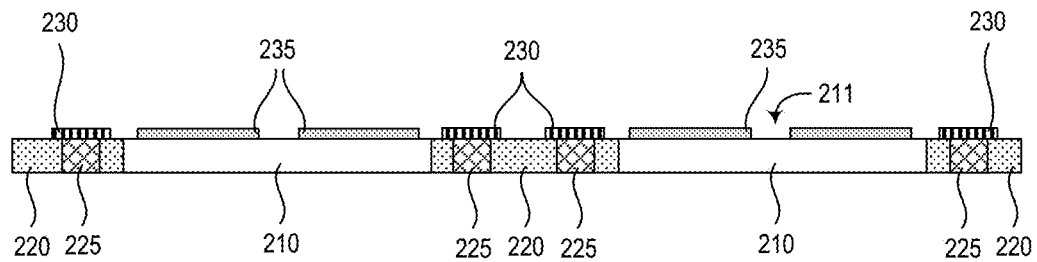

FIG. 3G illustrates the molding material 360 including the semiconductor dies 210 illustrated in FIG. 3F after the carrier substrate 365 has been detached (e.g., debonded). In FIG. 3G, the molding material 360 including the semiconductor dies 210 is flipped with respect to that of FIG. 3F.

Figure 3H:
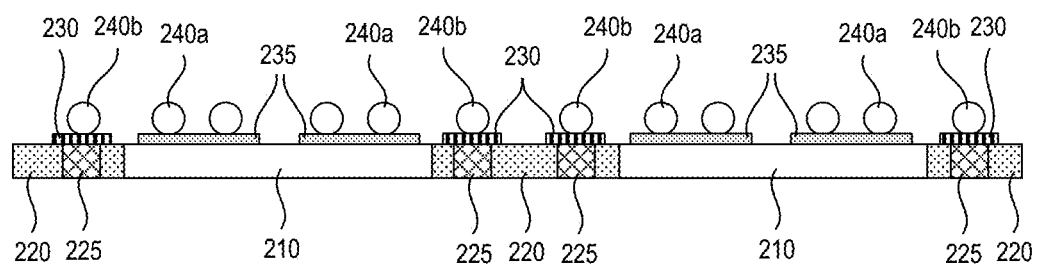

FIG. 3H illustrates the molding material 360 including the semiconductor dies 210 of FIG. 3G after first conductive bumps (several of which are identified as 240a) have been formed on the conductive traces 235—e.g., using a solder bumping process. Moreover, second conductive bumps (several of which are identified as 240b) have been formed on the conductive pads 230 connected to the TMVs 225.

Figure 3I:
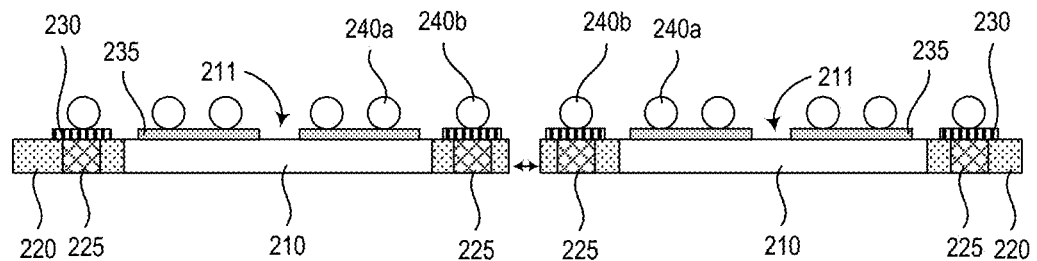

FIG. 3I illustrates that the molding material 360 including the semiconductor dies 210 of FIG. 3H after having been singulated such that individual semiconductor dies 210 can be used for further process steps to build the semiconductor device assembly 200. Various dicing techniques may be used to singulate the individual semiconductor dies 210, such as blade dicing, plasma dicing, or laser dicing techniques. The singulated first semiconductor die 210 includes at least one edge attached to a section of the molding material 360 having a subset of the TMVs 225.

As illustrated in FIG. 3I, individual semiconductor dies 210 are singulated to include TMVs 225 in the attached molding(s) 220 ("fanout TMVs"), which may be referred to as singulated fanout TMV semiconductor dies. The semiconductor die 210 includes a first side (e.g., the first side 211) having integrated circuitry of the semiconductor die 210, conductive traces (e.g., conductive traces 235) coupled with the integrated circuitry, and first conductive bumps (e.g., conductive bumps 240a) connected to the conductive traces. At least one edge of the semiconductor die 210 is attached to a molding (e.g., the molding(s) 220) that includes one or more TMVs (e.g., TMVs 225). Further, the molding has a first surface coplanar with the first side of the first semiconductor die 210, conductive landing pads (e.g., the conductive pads 230) connected to first ends of the one or more TMVs, and second conductive bumps (e.g., conductive bumps 240b) connected to the conductive landing pads. Further, the one or more TMVs are configured to couple with bond wires (e.g., the bond wires 115) at second ends of the TMVs, the second ends opposite to the first ends. The first and second conductive bumps (e.g., the conductive bumps 240a/b) are configured to directly couple to a printed circuit board (e.g., the PCB 125) such that the singulated fanout TMV semiconductor die can be directly attached to the PCB.

Subsequently, one or more second semiconductor dies (e.g., the semiconductor dies 210b-d described with reference to FIG. 2) may be attached to the second side 212 of the singulated semiconductor die 210. The one or more second semiconductor dies include bond pads (e.g., the bond pads 213) on their active sides that face away from the second side 212 of the singulated semiconductor die 210. After the second semiconductor dies are attached to the semiconductor die 210, bond wires (e.g., bond wires 115) can be formed to couple the bond pads of the second semiconductor dies to the TMVs 225 of the molding 220 attached to the singulated semiconductor die 210. Thereafter, the singulated semiconductor die 210 carrying the one or more second semiconductor dies and the molding 220 attached thereto can be attached to the PCB (e.g., the PCB 125) through the first and second conductive bumps (e.g., the conductive bumps 240a/b).

Figure 4:
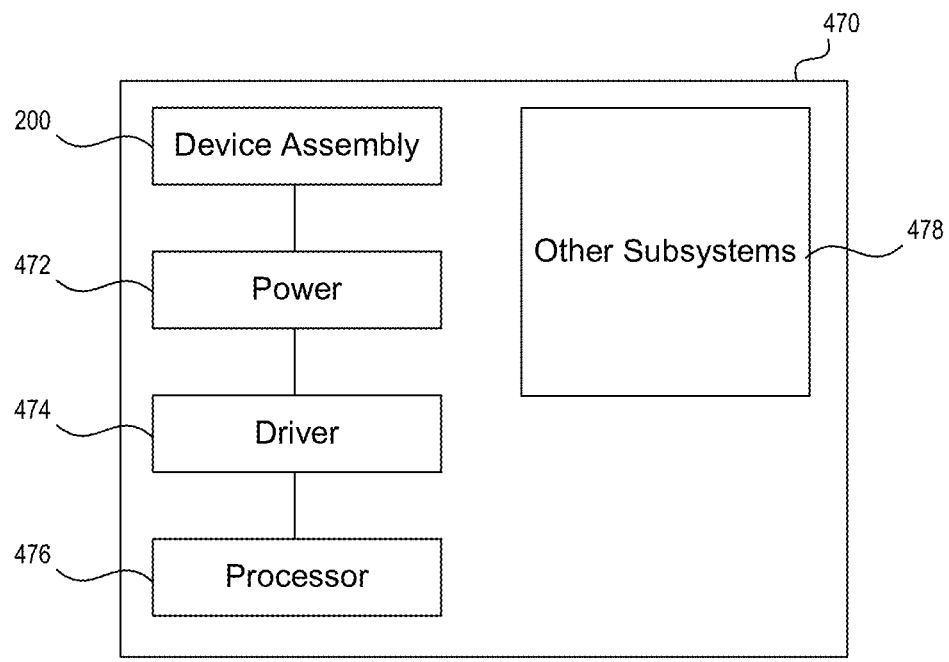
FIG. 4 is a block diagram schematically illustrating a system including a semiconductor device assembly configured in accordance with embodiments of the present technology.

The semiconductor die assemblies 200 described with reference to FIGS. 2-3I can be incorporated into any of a myriad of larger and/or more complex systems, a representative example of which is the system 470 shown schematically in FIG. 4. The system 470 can include the semiconductor device assembly 200, a power source 472, a driver 474, a processor 476, and/or other subsystems or components 478. The semiconductor device assembly 200 can include features generally similar to those of the hybrid fanout scheme described above. For example, the semiconductor dies of the semiconductor device assembly 200 have an increased thickness that mitigates various issues which may limit yield and/or reliability of the semiconductor device assembly 200—e.g., due to the semiconductor dies failing to satisfy die strength specifications rendering the semiconductor dies unreliable or non-functional. Further, the semiconductor device assembly 200 may not include a package substrate. The resulting system 470 can perform any of a wide variety of functions, such as memory storage, data processing, and/or other suitable functions. Accordingly, representative systems 470 can include, without limitation, hand-held devices (e.g., mobile phones, tablets, digital readers, and digital audio players), computers, and appliances. Components of the system 470 may be housed in a single unit or distributed over multiple, interconnected units (e.g., through a communications network). The components of the system 470 can also include remote devices and any of a wide variety of computer readable media.

Figure 5:
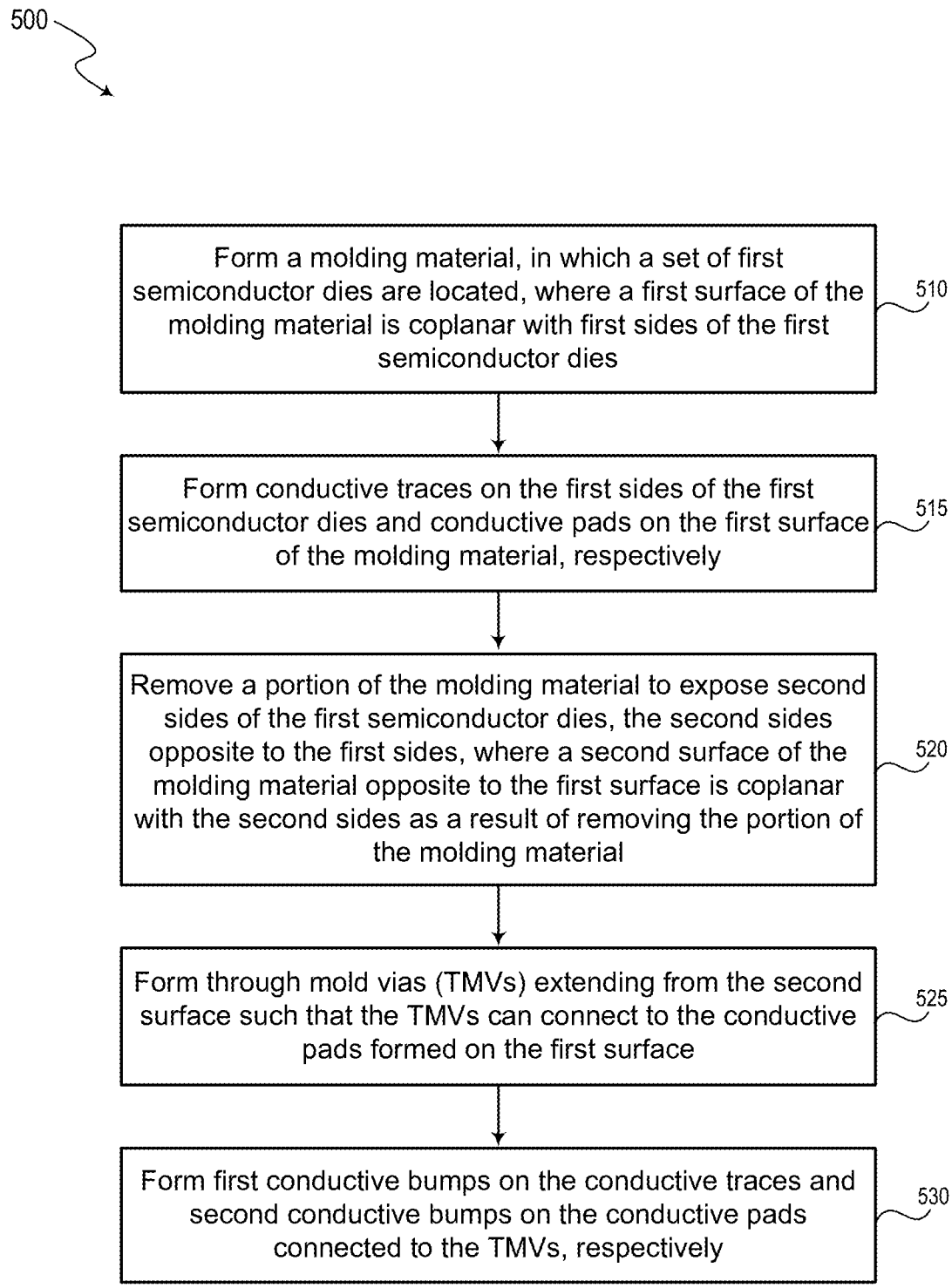
FIG. 5 is a flowchart of a method of forming a semiconductor device assembly in accordance with embodiments of the present technology.

FIG. 5 is a flowchart 500 of a method of forming a semiconductor device assembly (e.g., the semiconductor device assembly 200) in accordance with embodiments of the present technology. The flowchart 500 may include aspects of methods as described with reference to FIGS. 3A-3I.

The method includes forming a molding material, in which a plurality of first semiconductor dies are located, where a first surface of the molding material is coplanar with first sides of the first semiconductor dies (box 510). The method further includes forming conductive traces on the first sides of the first semiconductor dies and conductive pads on the first surface of the molding material, respectively (box 515). The method further includes removing a portion of the molding material to expose second sides of the first semiconductor dies, the second sides opposite to the first sides, where a second surface of the molding material opposite to the first surface is coplanar with the second sides as a result of removing the portion of the molding material (box 520). The method further includes forming through mold vias (TMVs) extending from the second surface such that the TMVs can connect to the conductive pads formed on the first surface (box 525). The method further includes forming first conductive bumps on the conductive traces and second conductive bumps on the conductive pads connected to the TMVs, respectively (box 530).

In some embodiments, the method may further include singulating individual first semiconductor dies from the molding material such that each individual first semiconductor die includes at least one edge attached to a section of the molding material having a subset of the TMVs. In some embodiments, the method may further include attaching one or more second semiconductor dies to the exposed second sides of individual first semiconductor dies, the one or more second semiconductor dies including bond pads. In some embodiments, the method may further include forming bond wires to couple the bond pads to the subset of the TMVs such that the one or more second semiconductor dies can transmit and/or receive signals through the bond wires coupled to the subset of the TMVs. In some embodiments, the method may further include attaching the first semiconductor die carrying the one or more second semiconductor dies to a printed circuit board (PCB) through the first and second conductive bumps.

In some embodiments, forming the molding material, in which the first semiconductor dies are located, may further include attaching the first sides of the first semiconductor dies to a mold frame through an adhesive material, dispensing the molding material over the first semiconductor dies attached to the mold frame, curing the molding material while applying pressure such that the molding material surrounds and attaches to the first semiconductor dies, and detaching the cured molding material, in which the first semiconductor dies are located, from the mold frame. In some embodiments, the method may further include removing, prior to attaching the first sides of the first semiconductor dies to the mold frame, portions of the first semiconductor dies from the second sides of the first semiconductor dies.

In some embodiments, removing the portion of the molding material may further include removing portions of the first semiconductor dies from the second sides of the first semiconductor dies to reduce a thickness of the first semiconductor dies to a predetermined thickness. In some embodiments, removing the portion of the molding material may further include attaching the conductive traces on the first sides of the first semiconductor dies and the conductive pads on the first surface of the molding material to a carrier substrate, and removing the portion of the molding material from the second surface of the molding material. In some embodiments, forming the TMVs from the second surface of the molding material is done while the first semiconductor dies and the molding material are attached to a carrier substrate.

It should be noted that the methods described above describe possible implementations, and that the operations and the steps may be rearranged or otherwise modified and that other implementations are possible. Furthermore, embodiments from two or more of the methods may be combined. Further, it will be appreciated that specific embodiments of the technology have been described herein for purposes of illustration, but that various modifications may be made without deviating from the disclosure.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method, comprising:
    forming a molding material, in which a plurality of first semiconductor dies are located, wherein a first surface of the molding material is coplanar with first sides of the first semiconductor dies;
    forming conductive traces on the first sides of the first semiconductor dies and conductive pads on the first surface of the molding material, respectively;
    removing a portion of the molding material to expose second sides of the first semiconductor dies, the second sides opposite to the first sides, wherein a second surface of the molding material opposite to the first surface is coplanar with the second sides as a result of removing the portion of the molding material;
    forming through mold vias (TMVs) extending from the second surface such that the TMVs can connect to the conductive pads formed on the first surface; and
    forming first conductive bumps on the conductive traces and second conductive bumps on the conductive pads connected to the TMVs, respectively.

2. The method of claim 1, further comprising:
    singulating individual first semiconductor dies from the molding material such that each individual first semiconductor die includes at least one edge attached to a section of the molding material having a subset of the TMVs.

3. The method of claim 2, further comprising:
    attaching one or more second semiconductor dies to the exposed second sides of individual first semiconductor dies, the one or more second semiconductor dies including bond pads.

4. The method of claim 3, further comprising:
    forming bond wires to couple the bond pads to the subset of the TMVs such that the one or more second semiconductor dies can transmit and/or receive signals through the bond wires coupled to the subset of the TMVs.

5. The method of claim 3, further comprising:
    attaching the first semiconductor die carrying the one or more second semiconductor dies to a printed circuit board (PCB) through the first and second conductive bumps.

6. The method of claim 1, wherein forming the molding material, in which the plurality of first semiconductor dies are located, further comprises:
    attaching the first sides of the first semiconductor dies to a mold frame through an adhesive material;
    dispensing the molding material over the first semiconductor dies attached to the mold frame;
    curing the molding material while applying pressure such that the molding material surrounds and attaches to the first semiconductor dies; and
    detaching the cured molding material, in which the first semiconductor dies are located, from the mold frame.

7. The method of claim 6, further comprising:
removing, prior to attaching the first sides of the first semiconductor dies to the mold frame, portions of the first semiconductor dies from the second sides of the first semiconductor dies.

8. The method of claim 1, wherein removing the portion of the molding material further comprises:
removing portions of the first semiconductor dies from the second sides of the first semiconductor dies to reduce a thickness of the first semiconductor dies to a predetermined thickness.

9. The method of claim 1, wherein removing the portion of the molding material further comprises:
attaching the conductive traces on the first sides of the first semiconductor dies and the conductive pads on the first surface of the molding material to a carrier substrate; and
removing the portion of the molding material from the second surface of the molding material.

10. The method of claim 1, wherein forming the TMVs from the second surface of the molding material is done while the first semiconductor dies and the molding material are attached to a carrier substrate.

11. A method, comprising:
forming a molding material, in which a first semiconductor die is located, wherein a first surface of the molding material is coplanar with a first side of the first semiconductor die;
forming one or more conductive traces on the first side of the first semiconductor die and one or more conductive pads on the first surface of the molding material, respectively;
removing a portion of the molding material to expose a second side of the first semiconductor die, the second side opposite to the first side, wherein a second surface of the molding material opposite to the first surface is coplanar with the second side as a result of removing the portion of the molding material;
forming one or more through mold vias (TMVs) extending from the second surface such that the one or more TMVs can connect to the one or more conductive pads formed on the first surface; and
forming one or more first conductive bumps on the one or more conductive traces and one or more second conductive bumps on the one or more conductive pads connected to the TMVs, respectively.

12. The method of claim 11, further comprising:
attaching one or more second semiconductor dies to the exposed second side of the first semiconductor die, the one or more second semiconductor dies including one or more bond pads.

13. The method of claim 12, further comprising:
forming one or more bond wires to couple the one or more bond pads to the one or more TMVs such that the one or more second semiconductor dies can transmit and/or receive signals through the one or more bond wires coupled to the one or more TMVs.

14. The method of claim 12, further comprising:
attaching the first semiconductor die carrying the one or more second semiconductor dies to a printed circuit board (PCB) through the first and second conductive bumps.

15. The method of claim 11, wherein forming the molding material, in which the first semiconductor die is located, further comprises:
attaching the first side of the first semiconductor die to a mold frame through an adhesive material;
dispensing the molding material over the first semiconductor die attached to the mold frame;
curing the molding material while applying pressure such that the molding material surrounds and attaches to the first semiconductor die; and
detaching the cured molding material, in which the first semiconductor die is located, from the mold frame.

16. The method of claim 15, further comprising:
removing, prior to attaching the first side of the first semiconductor die to the mold frame, one or more portions of the first semiconductor die from the second side of the first semiconductor die.

17. The method of claim 11, wherein removing the portion of the molding material further comprises:
removing one or more portions of the first semiconductor die from the second sides of the first semiconductor die to reduce a thickness of the first semiconductor die to a predetermined thickness.

18. The method of claim 11, wherein removing the portion of the molding material further comprises:
attaching the one or more conductive traces on the first side of the first semiconductor die and the one or more conductive pads on the first surface of the molding material to a carrier substrate; and
removing the portion of the molding material from the second surface of the molding material.

19. The method of claim 11, wherein forming the TMVs from the second surface of the molding material is done while the first semiconductor die and the molding material are attached to a carrier substrate.

* * * * *